United States Patent
Brown

(10) Patent No.: US 6,781,459 B1
(45) Date of Patent: Aug. 24, 2004

(54) CIRCUIT FOR IMPROVED DIFFERENTIAL AMPLIFIER AND OTHER APPLICATIONS

(75) Inventor: Albert Warren Brown, Santa Rosa, CA (US)

(73) Assignee: Omega Reception Technologies, Inc., Santa Rosa, CA (US)

( * ) Notice: Subject to any disclaimer, the term of this patent is extended or adjusted under 35 U.S.C. 154(b) by 0 days.

(21) Appl. No.: 10/423,141

(22) Filed: Apr. 24, 2003

(51) Int. Cl.[7] .............................. H03F 3/45
(52) U.S. Cl. ............................ 330/252; 330/295
(58) Field of Search ................... 330/252, 295, 330/310, 311, 84, 124 R

(56) References Cited

U.S. PATENT DOCUMENTS

| | | |
|---|---|---|
| 3,681,623 A | 8/1972 | Hoffman, Jr. et al. |
| 3,810,130 A | 5/1974 | Schneider |
| 3,898,483 A | 8/1975 | Sander et al. |
| 4,081,696 A | 3/1978 | Oda et al. |
| 4,181,981 A | 1/1980 | El-Kareh et al. |
| 4,267,521 A | 5/1981 | Yokoyama |
| 4,284,959 A | 8/1981 | Heagerty et al. |
| 4,333,058 A | 6/1982 | Hoover |
| 4,345,213 A | 8/1982 | Schade, Jr. |
| 4,749,955 A | 6/1988 | Cook |
| 4,769,564 A | 9/1988 | Garde |
| 4,797,630 A | 1/1989 | Brown |
| 4,881,023 A | 11/1989 | Perusse et al. |
| 4,882,706 A | 11/1989 | Sinclair |
| 4,885,477 A | 12/1989 | Bird et al. |
| 4,963,837 A | 10/1990 | Dedic |
| 4,987,379 A | 1/1991 | Hughes |
| 5,399,991 A | 3/1995 | Moraveji |
| 5,486,780 A | 1/1996 | Lu |
| 5,537,348 A | 7/1996 | Shou et al. |
| 5,546,045 A | 8/1996 | Sauer |
| 5,614,852 A | 3/1997 | Giordano et al. |
| 5,648,743 A * | 7/1997 | Nagaya et al. .............. 330/252 |
| 5,789,949 A | 8/1998 | Giordano et al. |
| 6,201,442 B1 | 3/2001 | James et al. |
| 6,282,138 B1 | 8/2001 | Wilkins |
| 6,304,142 B1 | 10/2001 | Madni |
| 6,515,547 B2 * | 2/2003 | Sowlati ..................... 330/311 |
| 6,590,456 B2 * | 7/2003 | Yang ......................... 330/311 |
| 2001/0006353 A1 | 7/2001 | Setty |

FOREIGN PATENT DOCUMENTS

JP 6226690 2/1987

* cited by examiner

Primary Examiner—Henry Choe
(74) Attorney, Agent, or Firm—David N. Lathrop, Esq.; Gallagher & Lathrop

(57) ABSTRACT

Differential amplifiers and phase-splitting circuits incorporate voltage-transfer or current-transfer devices of different conductivity types that are connected in series between two different potentials. The current flowing through the two devices is responsive to input signals provided to either or both of the devices. The two devices may be of different types such as bipolar transistors, field-effect transistors, vacuum tubes, triacs and silicon controlled rectifiers. Specific implementations include amplifiers with very low input capacitance and very low second harmonic distortion, multi-state memory cells, detectors and voltage regulators.

26 Claims, 6 Drawing Sheets

CIRCUIT FOR IMPROVED DIFFERENTIAL AMPLIFIER AND OTHER APPLICATIONS

TECHNICAL FIELD

The present invention pertains generally to electronic circuits and is more particularly directed toward novel electronic circuits that may be used in a wide range of applications with improved performance as compared to the performance achieved by conventional circuits.

BACKGROUND ART

Electronic circuits are used in a wide range of applications including amplification, signal generation, power regulation, digital memory, filtering, signal detection, and phase splitting. Although each application has unique needs, there is an interest common to many of such applications to improve circuit performance by reducing power requirements and reducing circuit complexity. Other areas of wide interest in applications such as amplification and signal generation include a desire to increase bandwidth, reduce noise, increase operational stability, improve input and output impedances, reduce stray inductive and capacitance, and reduce the so called Miller capacitance effect.

DISCLOSURE OF INVENTION

An object of the present invention is to provide a circuit that can be used in a wide range of applications to provide improvements like those mentioned above. In many cases, this object is achieved by reducing the complexity of circuits. Reduced complexity is often desirable because it generally offers advantages like reduced power losses, reduced space required to implement the circuit, and reduced stray inductance and capacitance. In other cases, this object is achieved by using circuit components in ways that allow advantageous characteristics of the circuit components to be exploited while avoiding their disadvantageous characteristics.

According to one aspect of the present invention, a differential amplifier circuit includes a first device of a first conductivity type comprising a first terminal coupled to an inverting input, a second terminal coupled to an output and coupled to a first potential, and a third terminal, wherein the first device alters magnitude of current that flows through the third terminal in response to a signal applied to the first terminal; a second device of a second conductivity type that is complementary to the first conductivity type comprising a fourth terminal coupled to the non-inverting input, a fifth terminal, and a sixth terminal coupled to a second potential, wherein the second potential differs from the first potential and the second device alters magnitude of current that flows through the fifth terminal in response to a signal applied to the fourth terminal; and a coupling in which potentials float with respect to the first potential and the second potential and that couples the fifth terminal to the third terminal such that a current flows between the first and second potentials through the first and second devices; wherein the differential amplifier provides an output signal at the output having a third potential that differs from the second potential, wherein the difference between the third potential and the second potential varies inversely with the signal applied to the inverting input and varies directly with the signal applied to the non-inverting input.

According to another aspect of the present invention, a phase-splitting circuit includes a first device of a first conductivity type comprising a first terminal coupled to a first input, a second terminal coupled to a first output and coupled to a first potential, and a third terminal, wherein the first device alters magnitude of current that flows through the third terminal in response to a signal applied to the first terminal; a second device of a second conductivity type that is complementary to the first conductivity type comprising a fourth terminal, a fifth terminal, and a sixth terminal coupled to a second output and coupled to a second potential, wherein the second potential differs from the first potential and the second device alters magnitude of current that flows through the fifth terminal in response to a signal applied to the fourth terminal; and a coupling in which potentials float with respect to the first potential and the second potential and that couples the fifth terminal to the third terminal such that a current flows between the first and second potentials through the first and second devices; wherein the phase-splitting circuit provides an output signal at the first output having a third potential that differs from the second potential, wherein the difference between the third potential and the second potential varies inversely with the signal applied to the first input, and wherein the phase-splitting circuit provides an output signal at the second output having a fourth potential that differs from the second potential, wherein the difference between the fourth potential and the second potential varies directly with the signal applied to the first input.

Another aspect of the present invention pertains to a method of operating a first device and a second device in a differential amplifier. The first device is of a first conductivity type, has a first terminal coupled to an inverting input, has a second terminal coupled to an output and coupled to a first potential, and has a third terminal; the second device is of a second conductivity type that is complementary to the first conductivity type, has a fourth terminal coupled to a non-inverting input, has a fifth terminal coupled to the third terminal by a coupling, and has a sixth terminal coupled to a second potential that differs from the first potential; and a current flows between the first and second potentials through the first and second devices. The method includes receiving a first input signal at the inverting input, wherein the first device alters magnitude of the current passing through the first device in response to the first input signal; passing the current through the coupling such that potentials within the coupling float with respect to the first potential and the second potential; receiving a second input signal at the non-inverting input, wherein the second device alters magnitude of the current passing through the second device in response to the second input signal; and providing an output signal at the output having a third potential that differs from the second potential, wherein the difference between the third potential and the second potential varies inversely with the first signal and varies directly with the second signal.

A further aspect of the present invention pertains to a method of operating a first device and a second device in a phase-splitter circuit. The first device is of a first conductivity type, has a first terminal coupled to an input, has a second terminal coupled to a first output and coupled to a first potential, and has a third terminal; the second device is of a second conductivity type that is complementary to the first conductivity type, has a fourth terminal, has a fifth terminal coupled to the third terminal by a coupling, and has a sixth terminal coupled to a second output and coupled to a second potential that differs from the first potential; and a current flows between the first and second potentials through the first and second devices. The method includes receiving an input signal at the input, wherein the first device alters magnitude of the current passing through the first device in response to the first input signal; passing the current through the coupling such that potentials within the coupling float with respect to the first potential and the second potential; providing a first output signal at the first output having a third potential that differs from the second potential, wherein the difference between the third potential and the second potential varies inversely with the input signal; and providing a second output signal at the second output having a fourth potential that differs from the second potential, wherein the difference between the fourth potential and the second potential varies directly with the input signal.

The various features of the present invention and its preferred embodiments may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. Long-Tail Pair

Figure 1:
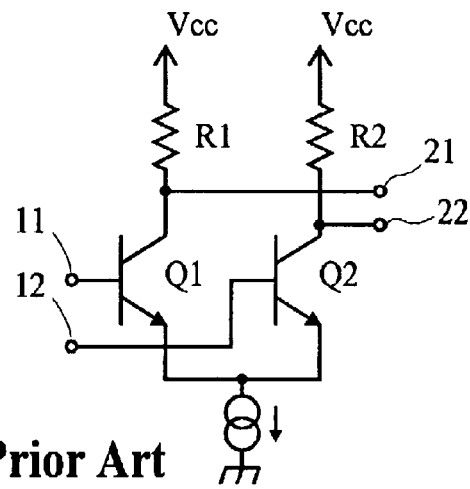
FIG. 1 is a schematic diagram of a long-tail pair circuit with a constant-current source.

A circuit known as the long-tail pair (LTP) is widely used in a number of applications including differential amplifiers and phase splitters. Unfortunately, the LTP has a number of disadvantages and limitations including the need for a constant current source. A schematic diagram of a LTP differential amplifier using two bipolar transistors is shown in FIG. 1. The circuit in this figure, as well as circuits in other figures, includes components that are useful to understand basic operating principles but it omits other components that may be useful for practical applications.

Figure 2:
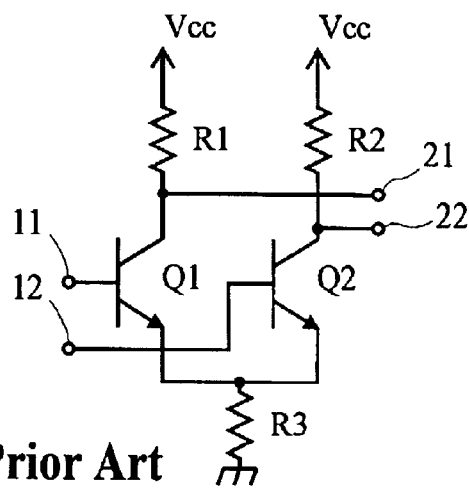
FIG. 2 is a schematic diagram of a long-tail pair circuit with a nearly constant-current source.

A constant current source is needed in the "tail" portion of a LTP circuit to balance its two output signals obtained from terminals 21 and 22. Constant current sources generally are not easily implemented and they increase cost and complexity of the LTP circuit. An LTP circuit can be implemented less expensively by compromising circuit performance and using a nearly constant-current source. Referring to the circuit shown in FIG. 2, for example, a high resistance R3 in the tail portion of the LTP circuit provides a nearly constant-current source. The value of this resistance and the voltage of the power supply must be adjusted to tradeoff between current regulation and amplifier dynamic range.

B. No-Tail Pair

1. Introduction

Figure 3:
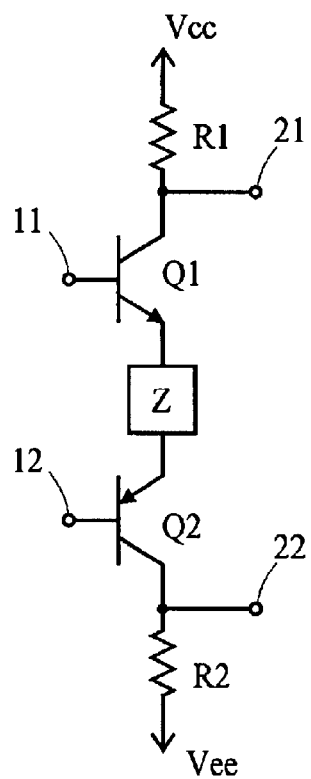
FIGS. 3–8 are schematic diagrams of circuits that may be used as differential amplifiers or phase splitters that incorporate various aspects of the present invention.
Figure 4:
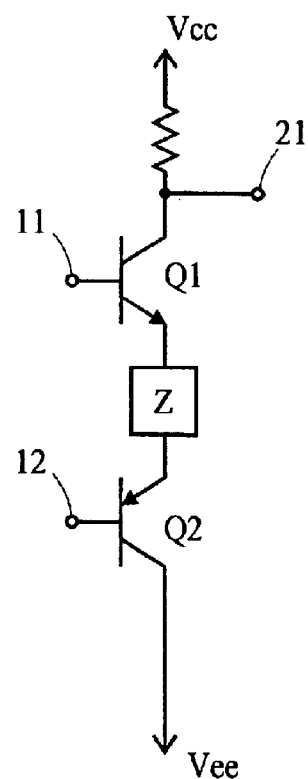
Figure 5:
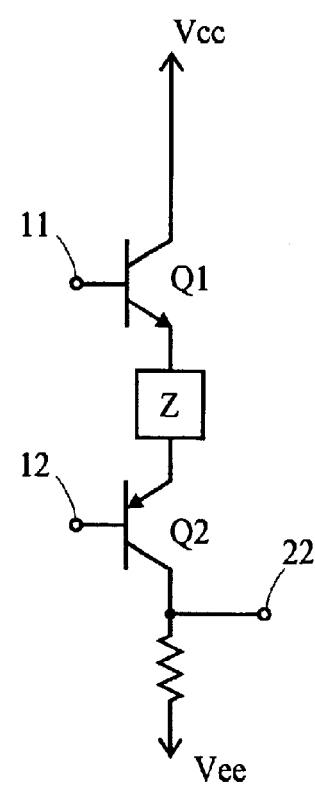

FIGS. 3–5 illustrate implementations of circuits with bipolar transistors that may be used as a general substitute for the LTP in a differential amplifier or phase splitter. The circuits shown in FIGS. 3–5 offer a number of advantages over the LTP including no need for a constant current source and a very high degree of isolation between input and output signals. Other advantages are discussed below. Because these circuits do not have a tail like the LTP, they are referred to herein as the "no-tail pair" (NTP).

Each of the circuits shown in FIGS. 3–5 uses two bipolar transistors of different conductivity types. The NPN transistor Q1 is of one conductivity type and the PNP transistor Q2 is of a different conductivity type. The base of transistor Q1 is coupled to input terminal 11, the collector of Q1 is coupled to potential Vcc, and the emitter of Q1 is coupled to component Z, described below. The base of transistor Q2 is coupled to input terminal 12, the collector of Q2 is coupled to potential Vee, and the emitter of Q2 is coupled to component Z. The transistors are coupled emitter-to-emitter in series between different potentials, which are shown as Vcc and Vee. In the particular circuit shown, Vcc is higher than Vee. Either potential can be above, below or at ground potential.

Component Z in the connection between emitters of the transistors may be a low resistance circuit path like a wire or circuit trace, it may be a resistor used for biasing the transistors and adjusting the quiescent current flowing through the transistors, or it may comprise other components to adapt this circuit to other applications in addition to amplification and phase splitting. Examples are discussed below. Potentials within component Z are allowed to float with respect to potentials Vcc, Vee and any other fixed potential.

The circuit shown in FIG. 3 has two output terminals 21 and 22 coupled to the collectors of transistors Q1 and Q2, respectively. The circuits shown in FIGS. 4 and 5 each have one output terminal, either terminal 21 or 22, coupled to the collector of transistor Q1 or Q2, respectively. The relationship between these terminals is explained in the following paragraphs.

The signals applied to terminals 11 and 12 may be referenced to essentially any desired potential including ground, which is not shown in the diagram. For example, the signal applied to terminal 11 may be referenced to terminal 12 and the signal applied to terminal 12 may be referenced to terminal 11. Similarly, signals received from terminals 21 and 22 may be referenced to essentially any desired potential including ground. In the circuit shown in FIG. 3, for example, a signal at terminal 21 may be referenced to terminal 22 and a signal at terminal 22 may be referenced to terminal 21.

The NTP shown in FIG. 3 may be used either as a differential amplifier or as a phase splitter. With respect to an output signal provided at terminal 21, input 11 is an inverting input and input 12 is a non-inverting input. With respect to an output signal provided at terminal 22, input 11 is a non-inverting input and input 12 is an inverting input. The inverting and non-inverting character of these terminals may be seen by recognizing an increase in current or voltage applied to terminal 11, which causes transistor Q1 to conduct a larger amount of current between its collector and emitter. The increase in current causes the voltage drop across resistor R1 to increase, thereby causing the voltage at terminal 21 to decrease. The increase in current also causes the voltage drop across resistor R2 to increase, thereby causing the voltage at terminal 22 to increase. Conversely, an increase in current or voltage applied to terminal 12 causes transistor Q2 to conduct a smaller amount of current between its collector and emitter. The decrease in current causes the voltage drop across resistor R1 to decrease, thereby causing the voltage at terminal 21 to increase. The decrease in current also causes the voltage drop across resistor R2 to decrease, thereby causing the voltage at terminal 22 to decrease.

If both input terminals 11 and 12 are used, the NTP operates as a differential amplifier with a very high level of common mode rejection. Depending on which output terminal is used, one or the other of the input terminals is the inverting input.

If both output terminals 21 and 22 are used, the NTP operates as a phase splitter. In a preferred implementation of a phase splitter, the potentials Vcc and Vee have equal magnitudes but opposite signs with respect to ground and the two output signals are referenced to ground. Depending on which input terminal is used, one or the other of the output terminals provides the inverted output. The ratio of variations in the output signals at terminals 21 and 22 is substantially equal to the ratio of the resistances R1/R2.

If all four terminals are used, the NTP provides inverted and a non-inverted output signals representing a difference between two input signals.

The NTP circuits shown in FIGS. 4 and 5 may be used as differential amplifiers. The operation of these circuits is analogous to the operation described above for the circuit shown in FIG. 3.

Figure 6:
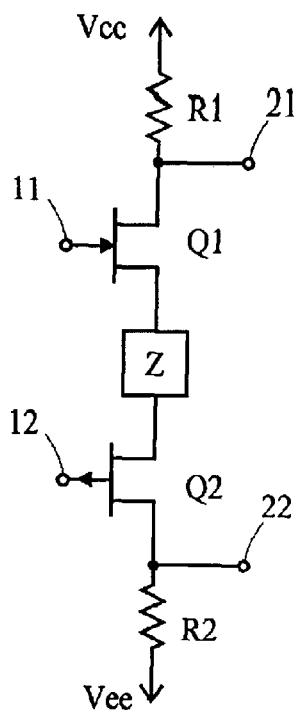
Figure 7:
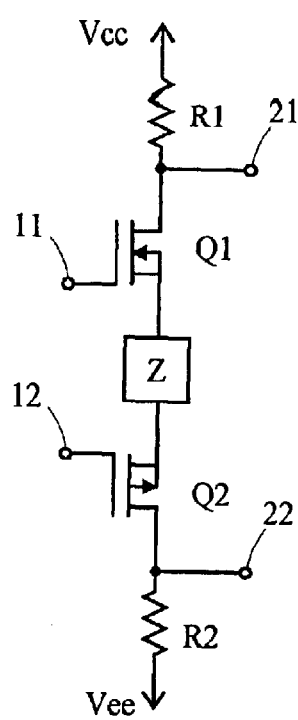
Figure 8:
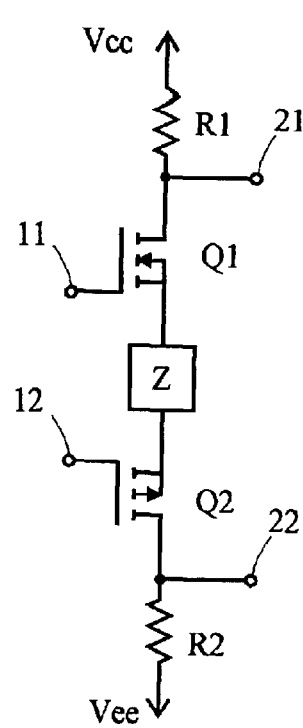

The NTP can be implemented by a variety of devices. Either current transfer or voltage transfer devices may be used. FIGS. 6–8 illustrate implementations that use junction field-effect transistors (JFET), depletion mode metal oxide semiconductor field-effect transistors (MOSFET) and enhancement mode MOSFET.

In FIG. 6, the gate of N-channel JFET Q1 is coupled to terminal 11, the drain of Q1 is coupled to potential Vcc, and the source of Q1 is coupled to component Z. The gate of P-channel JFET Q2 is coupled to terminal 12, the drain of Q2 is coupled to potential Vee, and the source of Q2 is coupled to component Z. Output terminals 21 and 22 are coupled to the drains of transistors Q1 and Q2, respectively. Either resistor R1 or R2 can be eliminated in a manner analogous to that shown in FIGS. 4 and 5.

The circuits shown in FIGS. 7 and 8 use depletion mode and enhancement mode MOSFET devices, respectively. In these circuits, the gate of N-channel MOSFET Q1 is coupled to terminal 11, the drain of Q1 is coupled to potential Vcc, and the source of Q1 is coupled to component Z. The gate of P-channel MOSFET Q2 is coupled to terminal 12, the drain of Q2 is coupled to potential Vee, and the source of Q2 is coupled to component Z. Output terminals 21 and 22 are coupled to the drains of transistors Q1 and Q2, respectively. Either resistor R1 or R2 can be eliminated as discussed above.

2. Hybrid Implementations

The NTP may also comprise different device types. Despite differences in gain and other operating characteristics of the two devices, the NTP can provide stable gains and gain ratios that are essentially independent of these differences. The input terminals and output terminals can be chosen to exploit the advantageous characteristics of each device.

Figure 9:
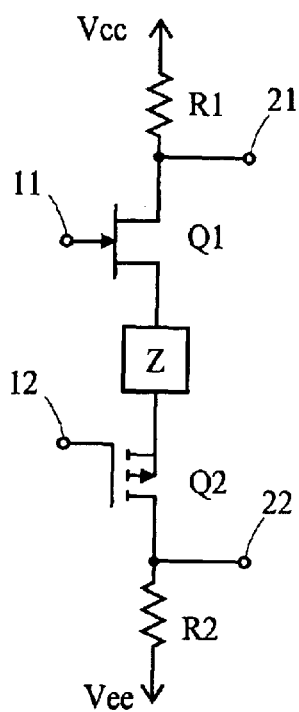
FIGS. 9–11 are schematic diagrams of circuits that may be used as differential amplifiers or phase splitters and include hybrid device types according to various aspects of the present invention.

The NTP in FIG. 9, for example, is a hybrid JFET/MOSFET circuit. In this hybrid, the terminal 11 connected to the JFET gate typically presents a higher input impedance and lower input capacitance than the terminal 12 connected to the MOSFET gate. The JFET also typically has higher gain, is more linear, and has less noise than the MOSFET. The MOSFET, however, typically has a better frequency response and is better suited for high-speed switching. A phase splitter having input characteristics of the JFET can be realized from the circuit shown in FIG. 9 by using the input terminal coupled to the JFET gate. A phase splitter having input characteristics of the MOSFET can be realized from this same circuit by using the input terminal coupled to the gate of the MOSFET.

The ability to use hybrids allow the NTP to incorporate devices like vacuum tubes and insulated gate bipolar transistors (IGBT) that have only one conductivity type. Vacuum tubes are capable of controlling very high voltages and large amounts of power. The IGBT possesses advantageous characteristics of PNP bipolar transistors and N-channel MOSFETs. It has a very high input impedance and very low input capacitance, and is capable of controlling very high output voltages. Characteristics such as these make these devices very desirable for use in the NTP for certain applications. Devices like the vacuum tube and the IGBT, for example, that have only one conductivity type can be used in NTP circuits by pairing these types of devices with another type of device having a different conductivity type.

Figure 10:
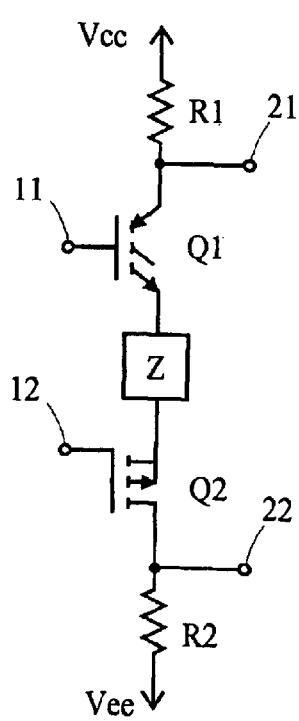

In the circuit shown in FIG. 10, for example, an IGBT is used with a P-channel MOSFET. The collector of IGBT Q1 is coupled to potential Vcc, the gate of Q1 is coupled to terminal 11, and the emitter of Q1 is coupled to component Z. Terminal 21 is coupled to the drain of Q1.

Figure 11:
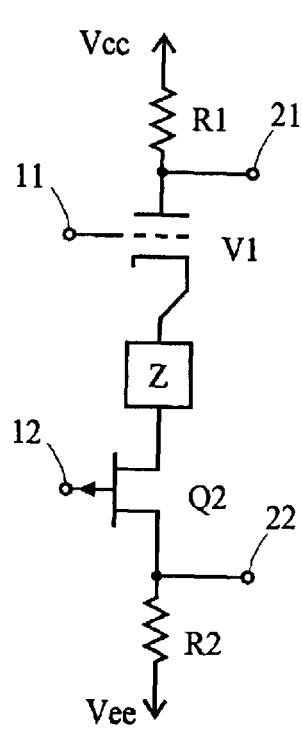

The circuit shown in FIG. 11 uses triode vacuum tube V1 and a P-channel JFET Q1. The grid of the triode is coupled to terminal 11, the plate of the triode is coupled to potential Vcc, and cathode of the triode is coupled to component Z.

Figure 12:
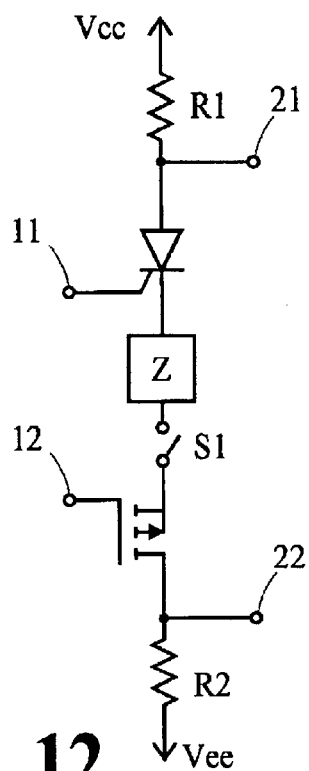
FIGS. 12–13 are schematic diagrams of circuits that incorporate unidirectional and bi-directional controlled rectifiers according to various aspects of the present invention.
Figure 13:
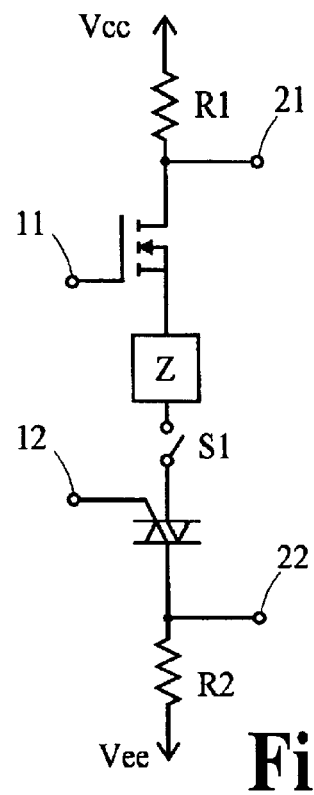

NTP circuits can also by implemented with devices like silicon controlled rectifiers (SCR) and triacs. Examples are shown in FIGS. 12 and 13 that use a MOSFET as the other device. The SCR may be used with a PNP bipolar transistor or P-channel device. The triac may be used with NPN or PNP bipolar transistors or P-channel or N-channel devices like field-effect transistors. A circuit using a P-channel MOSFET is shown in FIG. 13. Preferably, a way is provided to turn off the SCR or triac after it is turned on. This feature is illustrated schematically as switch S1 but can be implemented by essentially any means that can stop the series current or reduce series current to a sufficiently low level, such as by driving the other device in the NTP to a cutoff state.

C. Other Applications

The NTP circuit can be substituted for an operational amplifier (op amp) or other types of differential amplifiers in a wide range of applications including amplifiers, comparators and filters. For example, negative feedback may be used to control gain and frequency response, and positive feedback may be used to cause oscillation or to increase gain. A negative feedback path with appropriate resistive, capacitive and/or inductive components may connected from an output terminal to an inverting input terminal to implement a low-pass, high-pass or band-pass filter. A crystal or other resonant circuit may be incorporated into a positive feedback path to a non-inverting input to stimulate and control oscillation.

In addition, the NTP may be used in a number of other circuit applications. Some of these applications are discussed below.

1. Amplification a) Automatic Offset-Voltage Cancellation

Figure 14:
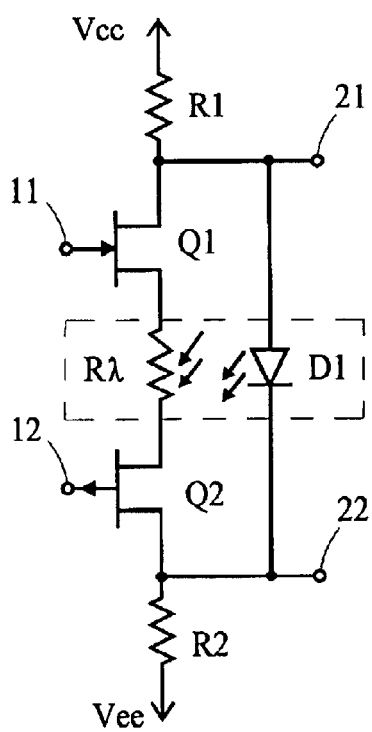
FIG. 14 is a schematic diagram of a differential amplifier with automatic offset-voltage cancellation.

The circuit illustrated in FIG. 14 shows a NTP differential amplifier with automatic offset-voltage cancellation. This circuit is similar to the circuit shown in FIG. 6 and it operates in a similar manner. The component Z is photosensitive resistor $R_\lambda$, whose resistance varies inversely with the amount of light emitted by light-emitting diode (LED) D1. The amount of light emitted by LED D1 varies directly with the difference in voltage between terminals 21 and 22. This arrangement has the effect of decreasing the series current flowing through devices Q1 and Q2 as the voltage difference between terminals 21 and 22 increases.

b) Reduced Input Capacitance

Figure 15:
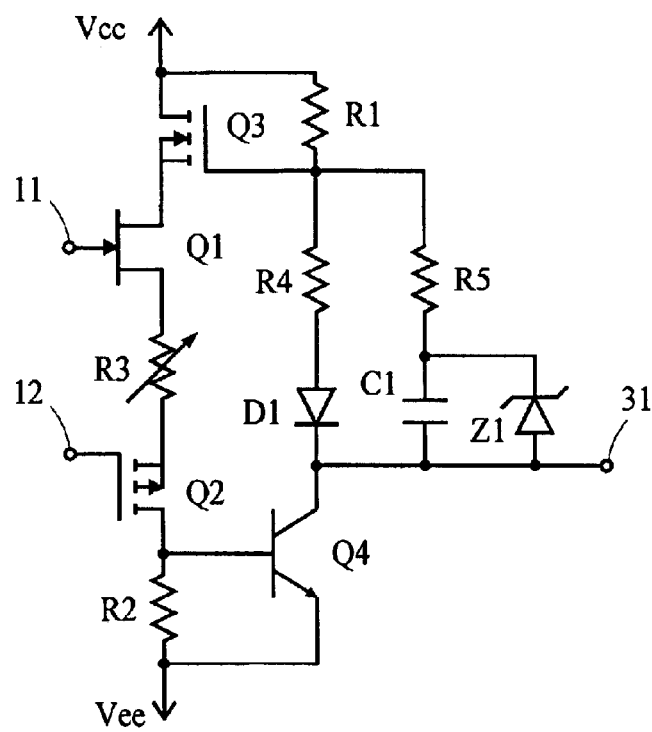
FIGS. 15–16 are schematic diagrams of amplifiers that exhibit very low input capacitance.
Figure 16:
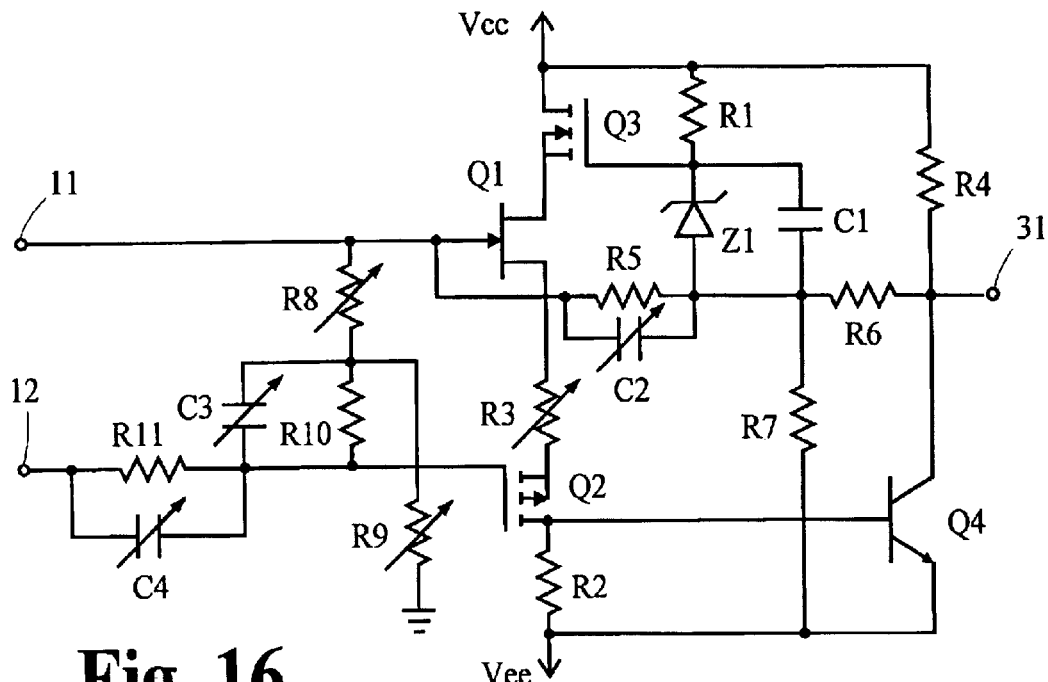

The circuits illustrated in FIGS. 15 and 16 show NTP amplifiers that exhibit very low input capacitance. The resistor R3 may be used to adjust the quiescent current flowing through devices Q1 and Q2, and may be used to adjust gain.

The values of resistors R1 and R5 may be varied to control the Miller capacitance effect that is present at input terminal 11. As the resistance of R1 or R5 is decreased, the amount of in-phase feedback to the drain of Q1 increases, which reduces the Miller capacitance effect. The feedback can be adjusted to lower the Miller capacitance effect to a negative value.

c) Two-Stage Amplifier

Figure 17:
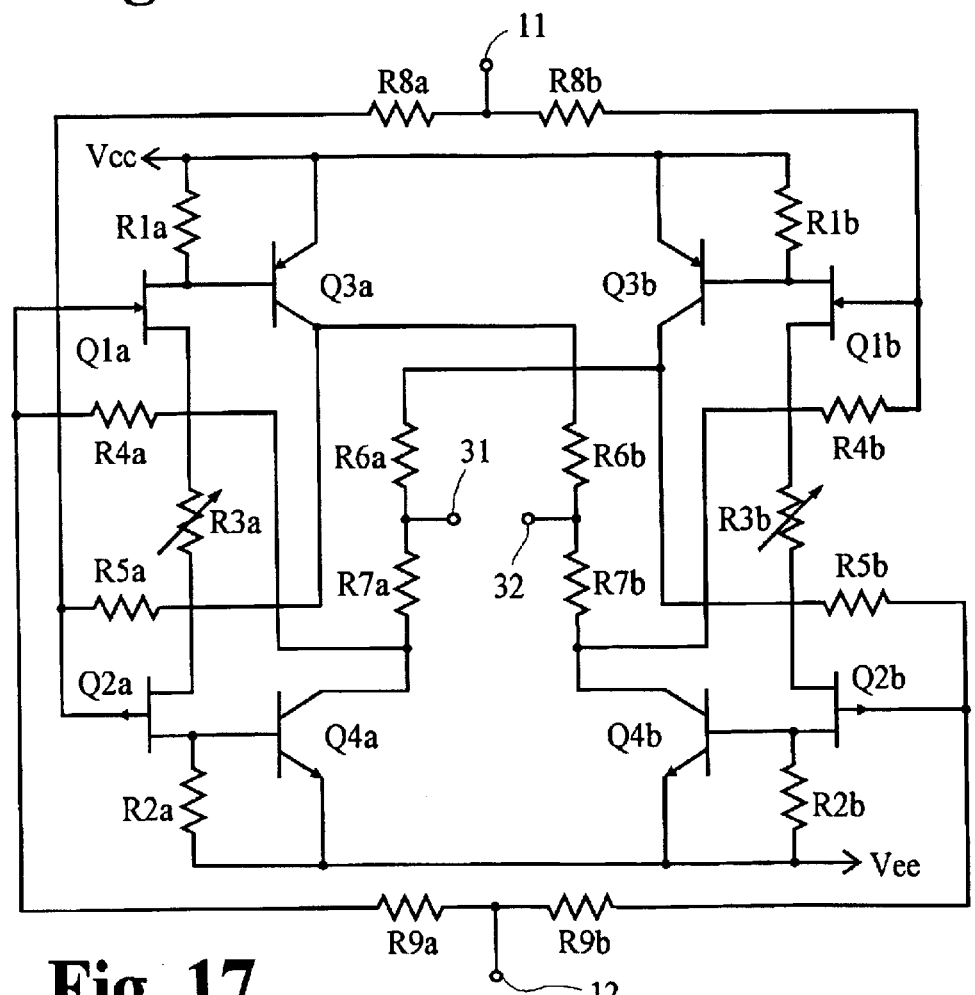
FIG. 17 is a schematic diagram of a two-stage differential amplifier with push-pull output stages.

FIG. 17 illustrates one way in which the NTP may be used to implement a two-stage differential amplifier in which two NTP circuits comprising FETs Q1a, Q2a, Q1b and Q2b are connected in a mirror configuration to drive respective push-pull output stages comprising bipolar transistors Q3a, Q4b, Q3b and Q4b. The mirror configuration reduces the magnitude of second harmonic distortion. Terminals 11 and 12 are the non-inverting and inverting inputs, respectively. Terminal 31 provides a non-inverting output with respect to the signal received at input terminal 11 and terminal 32 provides an inverting output with respect to the signal received at input terminal 11. Circuit component values are not critical. Resistors R3a and R3b are adjusted to set the desired quiescent current for each NTP.

2. Voltage Regulator

Figure 18:
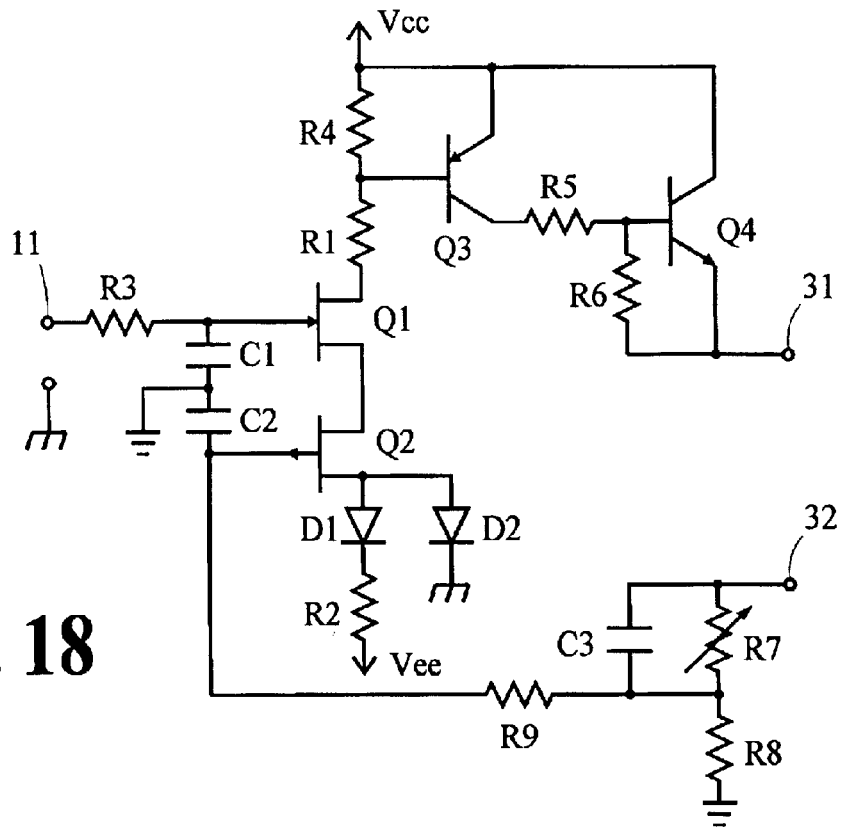
FIG. 18 is a schematic diagram of a regulated power supply.

FIG. 18 illustrates one way in which the NTP may be used to implement a regulated power supply that regulates the output voltage at terminal 31. The NTP comprises FETs Q1 and Q2 and uses the pinch-off voltage of transistors Q1 and Q2 to establish a reference voltage for the regulation circuit comprising bipolar transistors Q3 and Q4. Terminal 32 may be coupled to the high-voltage side of a load and used as a remote sense input to improve load-voltage regulation. Terminal 11 may be coupled to ground to provide a ground sense.

Circuit component values are not critical. The following may be used to provide an adjustable power supply with a nominal output voltage of about 15 volts: Q1=2N5457; Q2=2N5460; Q3=2N2222; Q4=2N6515; D1=1N004; D2=1N004; R1=835Ω; R2=120Ω; R3=20 KΩ; R4=1 KΩ; R5=22Ω; R6=220Ω; R7=30 kΩ; R8=10 kΩ; R9=22 kΩ; C1=0.1 μF; C2=68 pF; C3=0.1 μF; Vcc=22 v; and Vee=−15 v.

Components R1, C1 and C2 provide a low-pass filter to protect against interference from radio frequency (RF) and other high-frequency noise. Resistor R2 limits the series current flowing through FETs Q1 and Q2. The sum of the pinch-off voltages for FETs Q1 and Q2 provide a reference voltage for regulation. Diodes D1 and D2 protect the NTP against any reverse voltages. The values of resistors R1, R4, R5 and R6 are chosen according to the gain requirements and current and voltage limits of transistors Q3 and Q4. Resistors R7, R8 and R9 set the level of the regulated output voltage and capacitor C3 controls the response time of the regulator.

3. Detector

Figure 19:
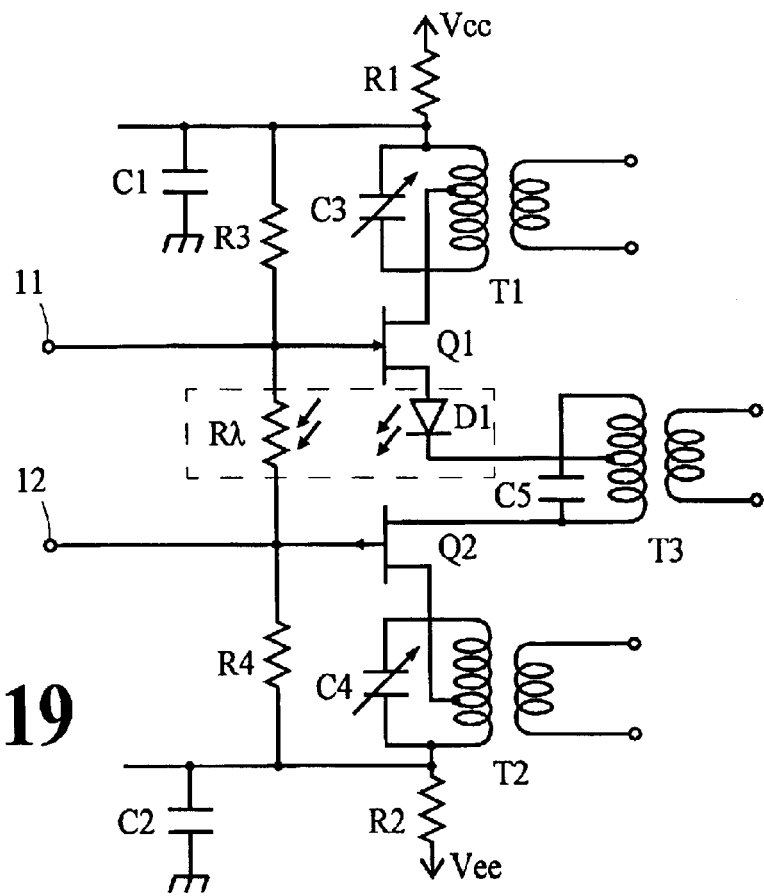
FIG. 19 is a schematic diagram of an amplitude modulation detector.

FIG. 19 illustrates one way in which the NTP may be used to implement an amplitude modulation (AM) detector. In the particular circuit that is shown, the NTP is used as an intermediate frequency (IF) tri-detector driver. Transformer T1 provides a signal detected from an upper sideband of an AM signal; transformer T2 provides a signal detected from a lower sideband of an AM signal, and transformer T3 provides the carrier and the main modulating signal. Variable capacitors C3 and C4 may be adjusted to tune the detected sidebands. LED D1 and photosensitive resistor Rλ provide a way to automatically bias the two active devices in the NTP.

4. Optical Circuit

Figure 20:
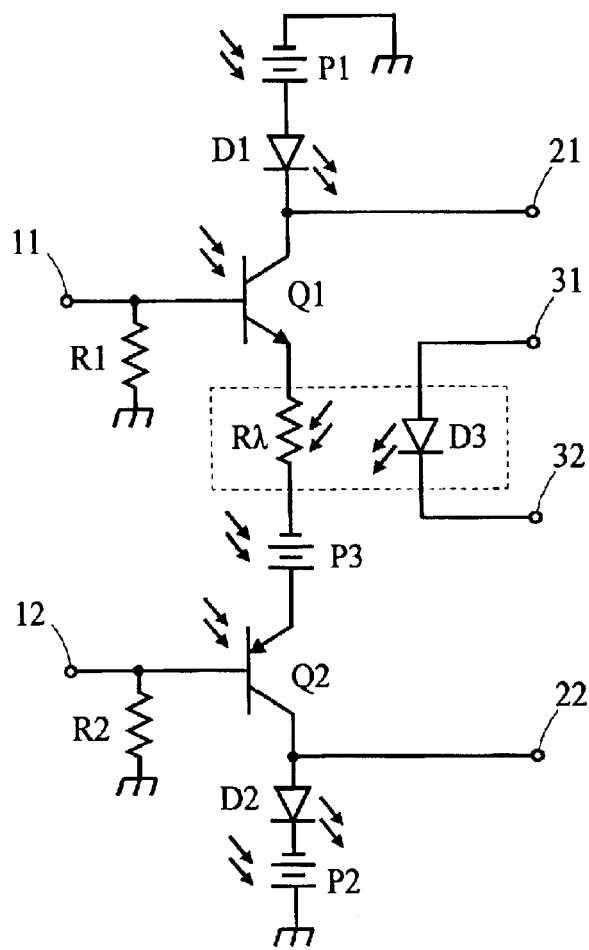
FIG. 20 is a schematic diagram of a no-tail pair circuit implemented by optical components.

FIG. 20 illustrates a circuit in which the NTP is implemented by optical components. Photosensitive transistors Q1 and Q2 receive optical input 13 and 14, respectively. LEDs D1 and D2 provide optical output. Electrical input from terminals 11 and 12 and electrical output from terminals 21 and 22 are also possible. LED D3 and photosensitive resistor Rλ provide a way to modulate the series current flowing through devices Q1 and Q2 in response to a signal applied to terminals 31 and 32.

In the particular circuit shown, photovoltaic cells P1, P2 and P3 provide power for the circuit. Any or all of the photovoltaic cells P1, P2 and P3 may be replaced or augmented by other sources of power. Alternatively, any or all of the photovoltaic cells P1, P2 and P3 may be reversed and used as loads.

5. Memory

Figure 21:
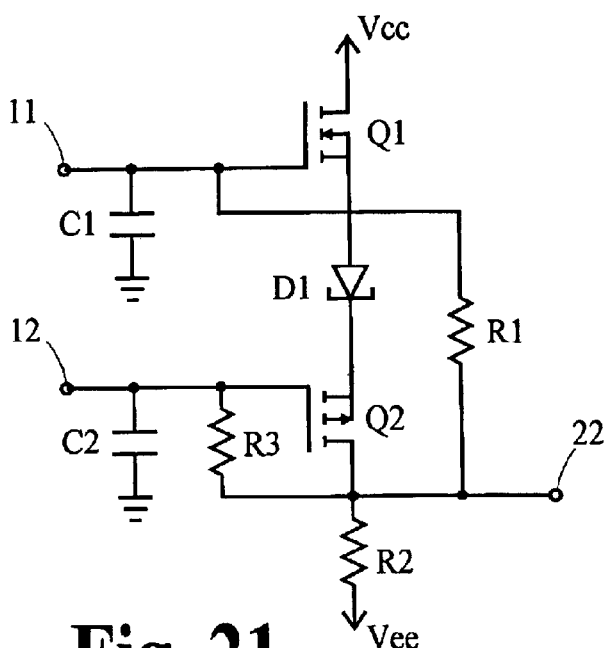
FIG. 21 is a schematic diagram of a multi-level memory circuit.

FIG. 21 illustrates a circuit in which a NTP circuit implements a memory cell that is capable of holding two or more voltage levels. Component Z in the NTP comprises a device that has negative resistance such as the tunnel diode D1. Both input terminals 11 and 12 are coupled to the output terminal 22 through resistors. The voltage levels that this circuit may hold may be expressed as $$V_o=(n \cdot V_P)-V_T$$

where $V_o$=the circuit output voltage;

n=a positive integer, $V_P$=total pinch-off voltage of Q1 and Q2; and $V_T$=a voltage at which the tunnel effect occurs.

Figure 22:
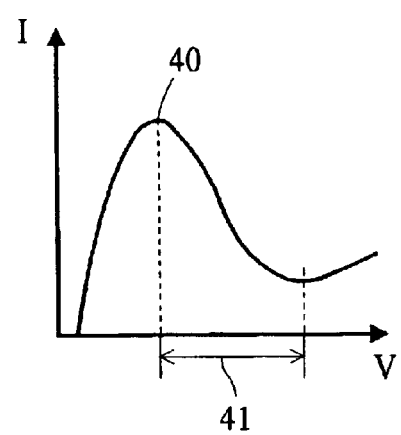
FIG. 22 is a schematic diagram of the current-voltage characteristics of a hypothetical tunnel diode.

The operating characteristic of a hypothetical tunnel diode is shown schematically in FIG. 22. The diode manifests a negative resistance in the range 41 of operating voltages. The voltage 40 is at the start of the tunneling effect. The tunnel voltage $V_T$ is selected so that is within the interval 41. Preferably, $V_T$ is chosen to be about ¼ $V_P$.

A positive-voltage signal applied to terminal 11 will increase the conductivity of Q1 and attempt to increase the current flowing through devices Q1 and Q2. Because of the negative resistance characteristic, the increase in current will cause the voltage across the diode D1 to decrease, thereby reducing the voltage level at input terminal 11. The reverse effect occurs for negative-voltage signals applied to terminal 11. The diode D1 will oppose voltage changes at terminal 11 unless the amount of change at terminal 11 is large enough to drive the diode D1 out of its tunneling region.

Similarly, a positive-voltage signal at terminal 12 will decrease the conductivity of Q2 and will attempt to decrease the current flowing through devices Q1 and Q2. Because of the negative resistance characteristic, the decrease in current will cause the voltage across the diode D1 to increase, thereby reducing the voltage level at input terminal 12. The reverse effect occurs for negative-voltage signals applied to terminal 12. The diode D1 will oppose voltage changes at terminal 12 unless the amount of change at terminal 12 is large enough to drive the diode D1 out of its tunneling region.

The number of voltage levels that can be held by this circuit is unlimited in principle but, in practical circuits, it is limited by the maximum forward current that can be passed by Q1 and Q2 and the forward breakdown voltage of Q1 and Q2.

What is claimed is:

1. An electronic circuit with an inverting input, a non-inverting input and an output, the electronic circuit comprising:

a first device of a first conductivity type comprising a first terminal coupled to the inverting input, a second terminal coupled to the output and coupled to a first potential, and a third terminal, wherein the first device alters magnitude of current that flows through the third terminal in response to a signal applied to the first terminal;

a second device of a second conductivity type that is complementary to the first conductivity type comprising a fourth terminal coupled to the non-inverting input, a fifth terminal, and a sixth terminal coupled to a second potential, wherein the second potential differs from the first potential and the second device alters magnitude of current that flows through the fifth terminal in response to a signal applied to the fourth terminal; and a coupling in which potentials float with respect to the first potential and the second potential and that couples the fifth terminal to the third terminal such that a current flows between the first and second potentials through the first and second devices;

wherein the electronic circuit provides an output signal at the output having a third potential that differs from the second potential, wherein the difference between the third potential and the second potential varies inversely with the signal applied to the inverting input and varies directly with the signal applied to the non-inverting input.

2. The electronic circuit according to claim 1 wherein:

the first device is from a set of different types of devices comprising a bipolar transistor, a field-effect transistor, a triac, an insulated-gate bipolar transistor, a silicon controlled rectifier and a vacuum tube, wherein the bipolar transistor has a base coupled to the first terminal, a collector coupled to the second terminal and an emitter coupled to the third terminal;

the field-effect transistor has a gate coupled to the first terminal, a drain coupled to the second terminal and a source coupled to the third terminal;

the triac has a gate coupled to the first terminal, a first power terminal coupled to the second terminal and a second power terminal coupled to the third terminal;

the insulated-gate bipolar transistor has a gate coupled to the first terminal, a collector coupled to the second terminal and an emitter coupled to the terminal;

the silicon controlled rectifier has a gate coupled to the first terminal, an anode coupled to the second terminal and a cathode coupled to the third terminal; and the vacuum tube has a grid coupled to the first terminal, a plate coupled to the second terminal and a cathode coupled to the third terminal; and the second device is from a set of different types of devices comprising a bipolar transistor, a field-effect transistor and a triac, wherein the bipolar transistor has a base coupled to the fourth terminal, a collector coupled to the sixth terminal and an emitter coupled to the fifth terminal;

the field-effect transistor has a gate coupled to the fourth terminal, a drain coupled to the sixth terminal and a source coupled to the fifth terminal; and the triac has a gate coupled to the fourth terminal, a first power terminal coupled to the sixth terminal and a second power terminal coupled to the fifth terminal.

3. The electronic circuit according to claim 2 wherein the first device and the second device are different types of devices.

4. The electronic circuit according to claim 1 wherein:

the first device is from a set of different types of devices comprising a bipolar transistor, a field effect transistor and a triac, wherein the bipolar transistor has a base coupled to the first terminal, a collector coupled to the second terminal and an emitter coupled to the third terminal;

the field-effect transistor has a gate coupled to the first terminal, a drain coupled to the second terminal and a source coupled to the third terminal; and the triac has a gate coupled to the first terminal, a first power terminal coupled to the second terminal and a second power terminal coupled to the third terminal; and the second device is from a set of different types of devices comprising a bipolar transistor, a field-effect transistor, a triac, an insulated-gate bipolar transistor, a silicon controlled rectifier and a vacuum tube, wherein the bipolar transistor has a base coupled to the fourth terminal, a collector coupled to the sixth terminal and an emitter coupled to the fifth terminal;

the field-effect transistor has a gate coupled to the fourth terminal, a drain coupled to the sixth terminal and a source coupled to the fifth terminal;

the triac has a gate coupled to the fourth terminal, a first power terminal coupled to the sixth terminal and a second power terminal coupled to the fifth terminal;

the insulated-gate bipolar transistor has a gate coupled to the fourth terminal, a collector coupled to the sixth terminal and an emitter coupled to the fifth terminal;

the silicon controlled rectifier has a gate coupled to the fourth terminal, an anode coupled to the sixth terminal and a cathode coupled to the fifth terminal; and the vacuum tube has a grid coupled to the fourth terminal, a plate coupled to the sixth terminal and a cathode coupled to the fifth terminal.

5. The electronic circuit according to claim 4 wherein the first device and the second device are different types of devices.

6. The electronic circuit according to claim 1 wherein:

the first device is a bidirectional conducting semiconductor device having a first gate, a first source and a first drain, the first terminal is coupled to the first gate, the second terminal is coupled to the first drain, and the third terminal is coupled to the first source; or the second device is a bidirectional conducting semiconductor device having a second gate, a second source and a second drain, the fourth terminal is coupled to the second gate, the fifth terminal is coupled to the second source, and the sixth terminal is coupled to the second drain.

7. An electric circuit with a first input, a first output and a second output, the phase splitting circuit comprising:

a first device of a first conductivity type comprising a first terminal coupled to the first input, a second terminal coupled to the first output and coupled to a first potential, and a third terminal, wherein the first device alters magnitude of current that flows through the third terminal in response to a signal applied to the first terminal;

a second device of a second conductivity type that is complementary to the first conductivity type comprising a fourth terminal, a fifth terminal, and a sixth terminal coupled to the second output and coupled to a second potential, wherein the second potential differs from the first potential and the second device alters magnitude of current that flows through the fifth terminal in response to a signal applied to the fourth terminal; and a coupling in which potentials float with respect to the first potential and the second potential and that couples the fifth terminal to the third terminal such that a current flows between the first and second potentials through the first and second devices;

wherein the electric circuit provides an output signal at the first output having a third potential that differs from the second potential, wherein the difference between the third potential and the second potential varies inversely with the signal applied to the first input, and wherein the phase electronic circuit provides an output signal at the second output having a fourth potential that differs from the second potential, wherein the difference between the fourth potential and the second potential varies directly with the signal applied to the first input.

8. The electric circuit according to claim 7 wherein:

the first device is from a set of different types of devices comprising a bipolar transistor, a field-effect transistor, a triac, an insulated-gate bipolar transistor, a silicon controlled rectifier and a vacuum tube, wherein the bipolar transistor has a base coupled to the first terminal, a collector coupled to the second terminal and an emitter coupled to the third terminal;

the field-effect transistor has a gate coupled to the first terminal, a drain coupled to the second terminal and a source coupled to the third terminal;

the triac has a gate coupled to the first terminal, a first power terminal coupled to the second terminal and a second power terminal coupled to the third terminal;

the insulated-gate bipolar transistor has a gate coupled to the first terminal, a collector coupled to the second terminal and an emitter coupled to the third terminal;

the silicon controlled rectifier has a gate coupled to the first terminal, an anode coupled to the second terminal and a cathode coupled to the third terminal; and the vacuum tube has a grid coupled to the first terminal, a plate coupled to the second terminal and a cathode coupled to the third terminal; and the second device is from a set of different types of devices comprising a bipolar transistor, a field-effect transistor and a triac, wherein the bipolar transistor has a base coupled to the fourth terminal, a collector coupled to the sixth terminal and an emitter coupled to the fifth terminal;

the field-effect transistor has a gate coupled to the fourth terminal, a drain coupled to the sixth terminal and a source coupled to the fifth terminal; and the triac has a gate coupled to the fourth terminal, a first power terminal coupled to the sixth terminal and a second power terminal coupled to the fifth terminal.

9. The electronic circuit according to claim 8 wherein the first device and the second device are different types of devices.

10. The electronic circuit according to claim 9 that comprises a third device from a set of different types of devices comprising a bipolar transistor, a field-effect transistor, an insulated-gate bipolar transistor and a vacuum tube, wherein for the third device:

the bipolar transistor has a base coupled to the first output;

the field-effect transistor has a gate coupled to the first output;

the insulated-gate bipolar transistor has a gate coupled to the first output; and the vacuum tube has a grid coupled to the first output.

11. The electronic circuit according to claim 10 that comprises a fourth device from a set of different types of devices comprising a bipolar transistor, a field-effect transistor, an insulated-gate bipolar transistor and a vacuum tube, wherein for fourth device:

the bipolar transistor has a base coupled to the second output;

the field-effect transistor has a gate coupled to the second output;

the insulated-gate bipolar transistor has a gate coupled to the second output; and the vacuum tube has a grid coupled to the second output.

12. The electronic circuit according to claim 8 with a second input coupled to the fourth terminal, wherein the different between the third potential and the second potential also varies directly with a signal applied to the second input and the difference between the fourth potential and the second potential also varies inversely with the signal applied to the second input.

13. The electronic circuit according to claim 7 wherein:

the first device is from a set of different types of devices comprising a bipolar transistor, a field effect transistor and a triac, wherein the bipolar transistor has a base coupled to the first terminal, a collector coupled to the second terminal and an emitter coupled to the third terminal;

the field-effect transistor has a gate coupled to the first terminal, a drain coupled to the second terminal and a source coupled to the third terminal; and the triac has a gate coupled to the first terminal, a first power terminal coupled to the second terminal and a second power terminal coupled to the third terminal; and the second device is from a set of different types of devices comprising a bipolar transistor, a field-effect transistor, a triac, an insulated-gate bipolar transistor, a silicon controlled rectifier and a vacuum tube, wherein the bipolar transistor has a base coupled to the fourth terminal, a collector coupled to the sixth terminal and an emitter coupled to the fifth terminal;

the field-effect transistor has a gate coupled to the fourth terminal, a drain coupled to the sixth terminal and a source coupled to the fifth terminal;

the triac has a gate coupled to the fourth terminal, a first power terminal coupled to the sixth terminal and a second power terminal coupled to the fifth terminal;

the insulated-gate bipolar transistor has a gate coupled to the fourth terminal, a collector to the sixth terminal and an emitter coupled to the fifth terminal;

the silicon controlled rectifier has a gate coupled to the fourth terminal, an anode coupled to the sixth terminal and a cathode coupled to the fifth terminal; and the vacuum tube has a grid coupled to the fourth terminal, a plate coupled to the sixth terminal and a cathode coupled to the fifth terminal.

14. The electronic circuit according to claim 13 wherein the first device and the second device are different types of devices.

15. The electronic circuit according to claim 14 that comprises a third device from a set of different types of devices comprising a bipolar transistor, a field-effect transistor, an insulated-gate bipolar transistor and a vacuum tube, wherein for the third device:

the bipolar transistor has a base coupled to the first output;

the field-effect transistor has a gate coupled to the first output;

the insulated-gate bipolar transistor has a gate coupled to the first output; and the vacuum tube has a grid coupled to the first output.

16. The electronic circuit according to claim 15 that comprises a fourth device from a set of different types of devices comprising a bipolar transistor, a field-effect transistor, an insulated-gate bipolar transistor and a vacuum tube, wherein for the fourth device:

the bipolar transistor has a base coupled to the second output;

the field-effect transistor has a gate coupled to the second output;

the insulated-gate bipolar transistor has a gate coupled to the second output; and the vacuum tube has a grid coupled to the second output.

17. The electronic circuit according to claim 13 with a second input coupled to the fourth terminal, wherein the difference between the third potential and the second potential also varies directly with a signal applied to the second input and the difference between the fourth potential and the second potential also varies inversely with the signal applied to the second input.

18. The electronic circuit according to claim 7 wherein:

the first device is a bidirectional conducting semiconductor device having a first gate, a first source and a first drain, the first is coupled to the first gate, the second terminal is coupled to the first drain, and the terminal is coupled to the first source; or the second device is a bidirectional conducting semiconductor device having a second gate, a second source and a second drain, the fourth terminal is coupled to the second gate, the fifth terminal is coupled to the second source, and the sixth terminal is coupled to the second drain.

19. The electronic circuit according to claim 7 with a second input coupled to the fourth terminal, wherein the difference between the third potential and the second potential also varies directly with a signal applied to the second input and the difference between the fourth potential and the second potential also varies inversely with the signal applied to the second input.

20. The electronic circuit according to claim 19 that comprises a light emitting component coupled between the first output and the second output, wherein the coupling comprises a light-sensitive resistance that changes its resistance in response to light emitted from the light emitting component.

21. The electronic circuit according to claim 19 comprising a first transformer having a first input winding a first output winding, a second transformer having a second input winding and a second output winding, a third transformer having a third input winding and a third output winding, a first capacitor, a second capacitor and a third capacitor, wherein the coupling comprises the third input winding and the third capacitor, and wherein the first capacitor and the first input winding are coupled in parallel to one another and are coupled to the first potential, and the first input winding has a tap that is coupled to the first output;

the second capacitor and the second input winding are coupled in parallel to one another and are coupled to the second potential, and the second input winding has a tap that is coupled to the second output; and the third capacitor and the third input winding are coupled in parallel to one another and are coupled to the fifth terminal, and the third input winding has a tap that is coupled to the third terminal.

22. The electronic circuit according to claim 21 that comprises a light emitting component interposed between the third terminal and the tap of the third input winding, and comprises a light-sensitive resistance coupled to the first input terminal and the second input terminal that changes its resistance in response to light emitted from the light emitting component.

23. The electronic circuit according to claim 1 wherein the coupling comprises a component having negative resistance within at least a portion of its operating voltage range, and the output is coupled to the non-inverting input and to the inverting input.

24. The electronic circuit according to claim 23 wherein the component having negative resistance is a tunnel diode, the output is coupled to the non-inverting input through a resistance, and the output is coupled to the inverting input through a resistance.

25. A method of operating a first device and a second device in an electronic circuit with an inverting input, a non-inverting input and an output, wherein
    the first device is of a first conductivity type, has a first terminal coupled to the inverting input, has a second terminal coupled to the output and coupled to a first potential, and has a third terminal,
    the second device is of a second conductivity type that is complementary to the first conductivity type, has a fourth terminal coupled to the non-inverting input, has a fifth terminal coupled to the third terminal by a coupling, and has a sixth terminal coupled to a second potential that differs from the first potential, and
    a current flows between the first and second potentials through the first and second devices;
wherein the method comprises:
    receiving a first input signal at the inverting input, wherein the first device alters magnitude of the current passing through the first device in response to the first input signal;
    passing the current through the coupling such that potentials within coupling float with respect to the first potential and the second potential;
    receiving a second input signal at the non-inverting input, wherein the second device alters magnitude of the current passing through the second device in response to the second input signal; and
    providing an output signal at the output having a third potential that differs from the second potential, wherein the difference between the third potential and the second potential varies inversely with the first signal and varies directly with the second signal.

26. A method of operating a first device and a second device in a an electric circuit with an input, a first output and a second output, wherein
    the first device is of a first conductivity type, has a first terminal coupled to the input, has a second terminal coupled to the first output and coupled to a first potential, and has a third terminal,
    the second device is of a second conductivity type that is complementary to the first conductivity type, has a fourth terminal, has a fifth terminal coupled to the third terminal by a coupling, and has a sixth terminal coupled to the second output and coupled to a second potential that differs from the first potential, and
    a current flows between the first and second potentials through the first and second devices;
wherein the method comprises:
    receiving an input signal at the input, wherein the first device alters magnitude of the current passing through the first device in response to the first input signal;
    passing the current through the coupling such that potentials within the coupling float with the respect to the first potential and the second potential;
    providing a first output signal at the first output having a third potential that differs from the second potential, wherein the difference between the third potential and the second potential varies inversely with the input signal; and
    providing a second output signal at the second output having a fourth potential that differs from the second potential, wherein the difference between the fourth potential and the second potential varies directly with the input signal.

* * * * *